United States Patent
Chan et al.

(10) Patent No.: US 6,274,214 B1
(45) Date of Patent: *Aug. 14, 2001

(54) MICROELECTRONIC PACKAGE MODULE WITH TEMPORARY LID

(75) Inventors: Joseph Ying-Yuen Chan, Fishkill, NY (US); John B. Pavelka, Plano, TX (US); Frank L. Pompeo, Montgomery; Hilton T. Toy, Wappingers Falls, both of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,871

(22) Filed: Dec. 7, 1999

Related U.S. Application Data

(63) Continuation of application No. 09/010,612, filed on Jan. 22, 1998, now Pat. No. 6,054,008.

(51) Int. Cl.[7] .............................. B32B 7/06; B32B 7/12; H01L 23/10
(52) U.S. Cl. .................... 428/40.1; 257/678; 257/704; 257/724
(58) Field of Search .................... 156/247, 249, 156/306.6, 349, 540, 541, 556; 29/830, 831, 832, 840, 740, 743; 257/678, 704, 724; 428/40.1

(56) References Cited

U.S. PATENT DOCUMENTS

| | | |
|---|---|---|
| 5,407,865 | 4/1995 | Glovatsky et al. . |
| 5,477,009 | 12/1995 | Brendecke et al. . |
| 5,667,884 | 9/1997 | Bolger . |
| 5,706,579 | 1/1998 | Ross . |
| 5,789,810 | 8/1998 | Gross et al. . |
| 5,825,195 * | 10/1998 | Hembree et al. . |
| 5,868,887 | 2/1999 | Sylvester et al. . |
| 5,880,524 | 3/1999 | Xie . |
| 5,990,418 * | 11/1999 | Bivona et al. . |
| 6,051,888 * | 4/2000 | Dahl . |

* cited by examiner

*Primary Examiner*—Curtis Mayes
(74) *Attorney, Agent, or Firm*—Ratner & Prestia; Tiffany L. Townsend, Esq.

(57) ABSTRACT

A process and apparatus for picking up and moving a microelectronic package during card assembly operations. A temporary lid having a top surface and a bottom surface attaches to at least one microchip on a substrate via a double-sided adhesive. The top surface of the lid provides a clean, smooth, flat surface to which a vacuum probe may be attached. After completion of the steps where vacuum probe movement is required, the lid and adhesive may be removed from the at least one microchip by pulling them both off together. No residue is left on the microchips.

13 Claims, 2 Drawing Sheets

MICROELECTRONIC PACKAGE MODULE WITH TEMPORARY LID

This application is a continuation of U.S. patent application Ser. No. 09/010,612, filed on Jan. 22, 1998, now U.S. Pat. No. 6,054,008.

FIELD OF THE INVENTION

The present invention relates generally to electronic device packaging. More particularly, this invention includes a process and apparatus for securing a temporary lid to a chip carrier to aid in movement of the chip carrier during automated card assembly operations.

BACKGROUND OF THE INVENTION

The increasing use of ceramic, multiple-chip modules incorporating flip-chip devices has caused correspondingly larger demands on card assembly machines which perform high-speed "pick-and-place" operations. The ever-increasing range of possible chip layouts and encapsulation schemes exacerbates those demands. Therefore, the card assembly machines have had to become, and continue to become, better suited to perform pick-and-place operations on chip modules during card assembly.

Typically, in the case of common, plastic, overmolded, dual-in-line packages (DIPs), automated picking of the components is performed by a vacuum probe. The vacuum probe attaches to the card package by contacting the flat, plastic, outer surface of the chip. The difference in pressure between the ambient atmosphere and the inside of the vacuum probe (with the chip surface sealing the probe opening) keeps the package attached to the probe until the vacuum is released, which releases the package from the tip of the vacuum probe. FIG. 1 illustrates this process according to the prior art, where vacuum probe 110 is shown attached to the module 100 through contact with chip 120. module 100 is typically referred to as a capless chip module. The module 100 of FIG. 1 is shown as already placed and seated on a printed circuit board 130.

FIG. 1 also shows additional components of a typical capless chip module 100, seated on top of a printed circuit board 130, according to the prior art. Printed circuit board 130 supports a plurality of solder balls 140 which in turn support a substrate 150 (often, but not necessarily, ceramic). If the substrate is ceramic, the substrate 150 and its solder balls form what is known as a ceramic ball grid array (CBGA). Alternatively, a ceramic column grid array (CCGA) (not shown) technology could be used. The chip 120 has an upper face and a lower face and is attached on its lower face to the substrate 150. Typically, the chip 120 is secured to the substrate 150 via a plurality of controlled collapse chip connection (C4) balls 145.

The substrate 150 could also have one or more electronic devices 160 attached to it via the C4 balls 145. Examples of such electronic devices include decoupling capacitors, resistors, capacitors, and inverters. In addition, these devices could be attached to the substrate 150 not by C4 balls 145, but rather by surface-mountable solder (not shown). For reliability reasons, the C4 balls are encapsulated with a polymeric underfill material 170. Where multiple chips and electronic devices are combined on one substrate, as in FIG. 2, the package is typically referred to as a multiple chip module (MCM).

In a typical card assembly manufacturing process, a pick-and-place tool picks up each module 100 that is to be joined to the printed circuit board and places it in the proper location. The printed circuit board 130 and these placed modules 100 are then heated in a card assembly heating apparatus and the solder balls 140 are "reflowed" causing the connection of module 100 and printed circuit board 130 to occur.

As MCMs become larger and more specialized, automated pick-up and placement of cap-less modules become more difficult because the chip center lines may be located on an asymmetric grid with respect to the center line of the module. In other words, with a multitude of chips and components on the substrates (as is the trend), there may not be a clean, flat, and smooth surface available in the middle of the module to which the vacuum probe can attach. Non-flat surfaces having encapsulants, glob top, or other polymeric materials also create problems for pick-up tools. Unless the card assembly picking tooling is automated and flexible enough to locate a chip surface off the packaging center (even in a high-speed mode), tool efficiency will suffer greatly, because many chips will simply not be picked up without changes being made in the tooling each time a module type is run. Specifically, many automated pick-andplace tools cannot move off module centers and such tools cannot practically be modified (due, in part, to cost constraints). Moreover, the vacuum probe method is most economical and efficient for packages having a relatively flat top surface. It is often not well suited, however, to making dynamic, offset motions needed to accommodate off center device locations, nor is it effective in spanning multiple chips, unless a custom pick-up probe is fitted to each package type.

FIG. 3 illustrates another process for moving chip modules 100 during production according to the prior art. In the case of such a standard capped module, the center of the lid is used for pick and place operations. The module shown in FIG. 3 is typically referred to as a capped module, because a module cap 210 is used. Here, vacuum probe 110 is attached not to a chip, but rather to module cap 210. Module cap 210 is attached to substrate 150 of module 100 via a cap seal 220 (adhesive for non-hermetic modules and solder or glass for hermetic modules). Module cap 210 is attached to chips 120 via a semi-liquid or paste-type, thermally conductive material 230. It is important that cap 210 be attached to each chip 120 through a thermally conductive material because the chips would otherwise overheat during operation. Module cap 210 is typically metal and presents a clean, smooth, flat surface to vacuum probe 110.

In the package assembly shown in FIG. 3, because the cap 210 is attached to the substrate 150 via a cap seal 220, the attachment is substantially permanent. If the cap 210 is removed from the substrate 150 at some later step for rework in the manufacturing process, the substrate 150 may be damaged, or seal material may be left behind. Such a condition increases the risk of damage when additional components are subsequently reworked to the substrate 150. The trend is away from module caps 210 and toward non hermetic packaging methods.

In the device as illustrated in FIG. 3, the chips 120 are attached to the module cap 210 via thermally conductive material 230 which transfers heat from the chips 120 to the module cap 210 where it can be further dissipated. The necessity of a thermally conductive material 230 for capped modules adds to the cost of reworking and adds a higher rate of unreliability to the package.

The deficiencies of the conventional manufacturing techniques show that a need still exists for a process and apparatus which will accurately and reliably attach a temporary, removable lid to a chip carrier to allow vacuum pick-up by high-speed, automated assembly tools. Another object of the present invention is to provide an apparatus and process for attaching a temporary, removable lid to a chip carrier to allow vacuum pick-up by high-speed, automated assembly tools. Therefore, one object of the present invention is to provide an apparatus and process for attaching a temporary metal lid to a chip carrier containing one or more flip chip devices using a double-sided, pressure sensitive tape that allows efficient vacuum pick-up by high speed, automated assembly tools.

Still another object of the present invention is to provide a process and apparatus for ensuring mechanical and operational integrity of the bond between devices on the substrate and a heatslug, especially under typical shipping and use conditions such as gravity, mechanical shock, vibration, high temperature, humidity, and repeated thermal expansion and contraction cycles due to temperature cycling during operation.

Yet another object of the present invention is to provide a process and apparatus that will absorb thermally induced strain without damage to the chip carrier or associated devices. A further object of the present invention is to provide a process and apparatus for removing the temporary lid from a device, or a plurality of devices, following card assembly processing which does not result in mechanical damage to the device or leave an adhesive residue layer that would impede subsequent heatsink attachment schemes which may involve the use of additional, different adhesive compounds.

SUMMARY OF THE INVENTION

To achieve these and other objects, and in view of its purposes, the present invention provides a process and apparatus for high speed pick-up and placement of a chip module during card assembly A lid is temporarily attached to the top surface of one or more microchips via a double sided adhesive tape. The lid provides a smooth, flat, and clean contact area for a vacuum probe to pick up the module. During manufacturing steps which require the movement of the module, the lid is maintained in place. After reflow is complete and the module is attached to a printed circuit board, the lid is simply pulled away from the mounted module, complete with the double-sided adhesive tape. The double-sided adhesive tape leaves no residue on the top surfaces of the microchips.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
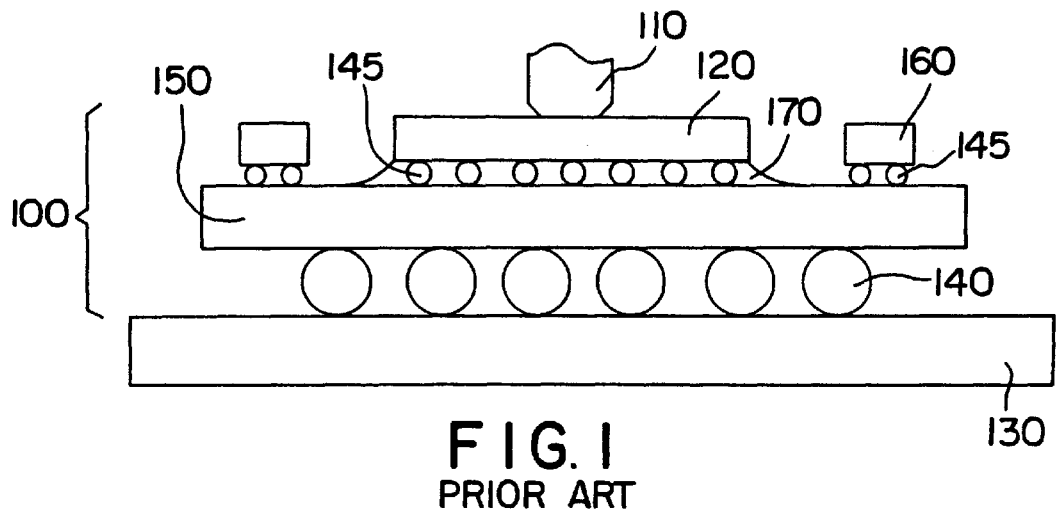
FIG. 1 illustrates an apparatus picking up a capless chip module according to the prior art.
Figure 2:
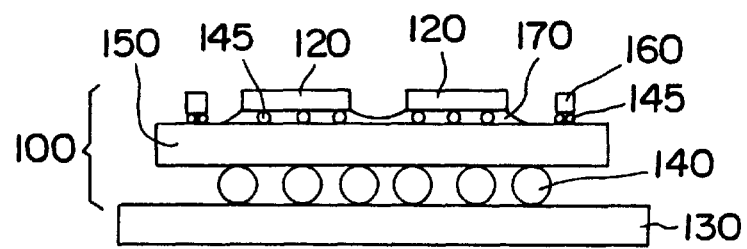
FIG. 2 illustrates a capless, multiple chip module.
Figure 3:
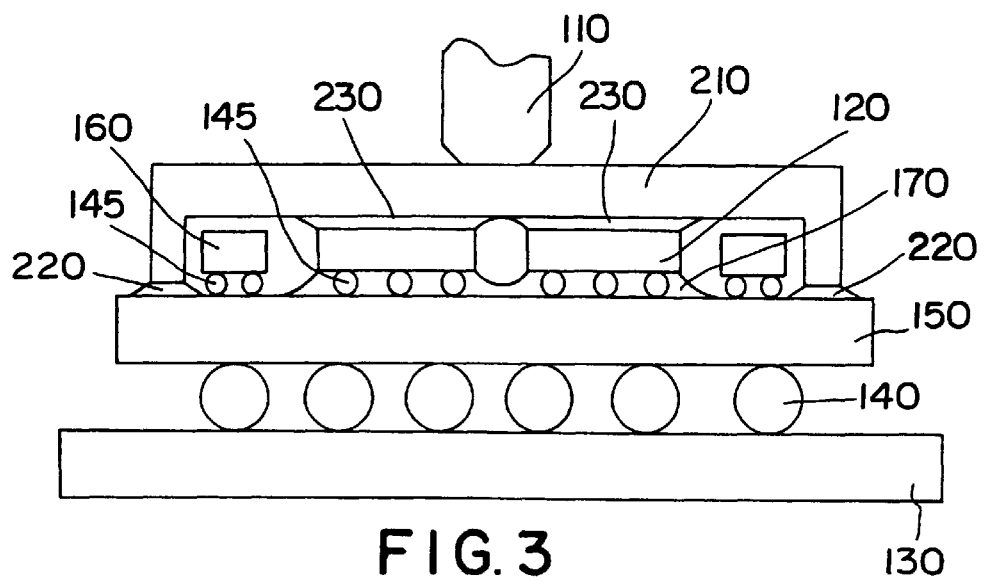
FIG. 3 illustrates an apparatus picking up a capped, multiple chip module according to the prior art.

The present invention provides a process and apparatus for high-speed pick-up and placement of electronic components for card assemblers. The invention provides a temporary lid attachment (TLA) affixed directly, and only, to the tops of one or more chips of the substrate. The affixation is accomplished with a double-sided tape. The top of the TLA serves as a clean, flat, and smooth surface to which the vacuum probe can attach and pick up the chip package. After the desired processing steps are complete, the TLA can be cleanly and completely removed from the chip or chips along with the tape. Each labeled element of the drawing maintains its reference number in all figures throughout the drawing.

Figure 4:
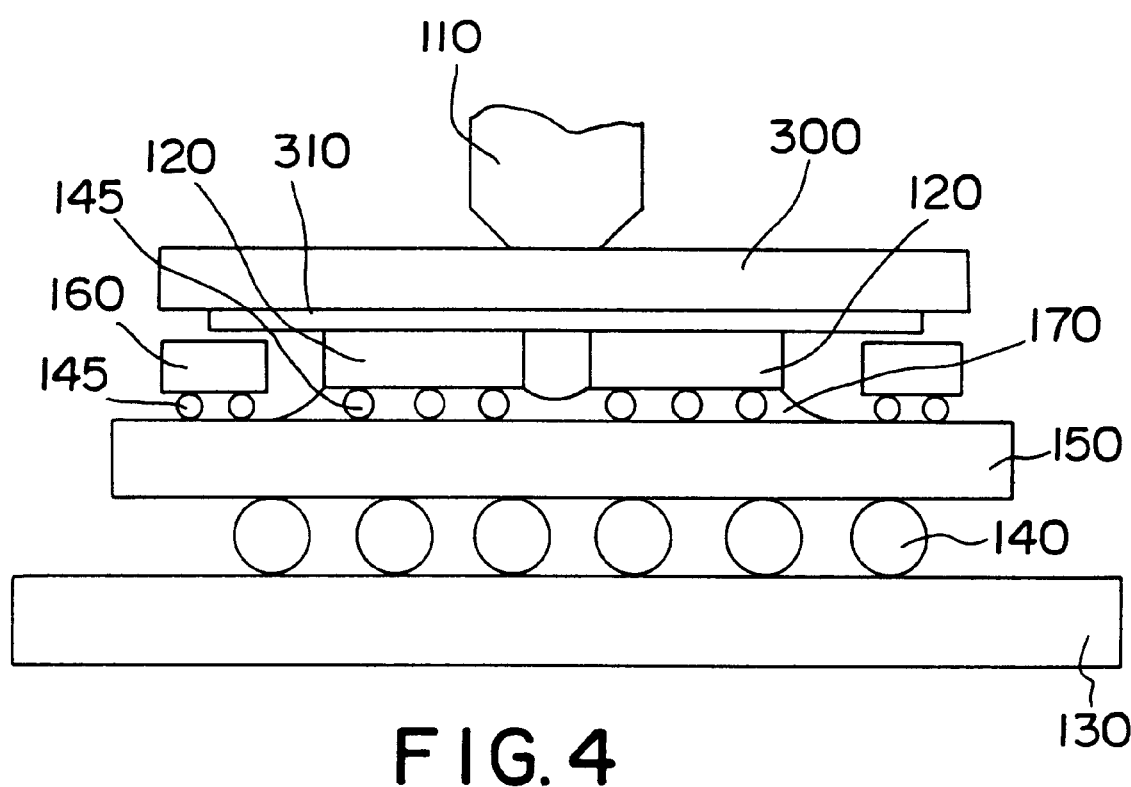
FIG. 4 illustrates an apparatus picking up a capped, multiple chip module according to the present invention.

FIG. 4 illustrates the present invention with temporary lid attachment (TLA) 300 shown attached to chips 120. Double-sided adhesive tape 310 bonds to the lower surface of TLA 300 and to the upper surface of chips 120. The modules 100 may be joined to the printed circuit board 130 by via ceramic ball grid arrays (CBGA) (shown in FIG. 4) or ceramic column grid arrays (CCGA). In addition, the modules 100 could be joined to the printed circuit board 130 by wire bond, tabs, and other joining techniques. The module 100 could be either a single chip capless module or a multiple chip capless module. The chips 120 are secured to the substrate 150 via a plurality of controlled collapse chip connection (C4) balls 145 (shown in FIG. 4) or by a surface mountable solder (not shown). The substrate 150 could also have one or more electronic devices 160. For reliability purposes, the C4 balls 145 are encapsulated in a polymeric underfill material 170.

Because TLA 300 does not connect at all to substrate 150, and air is allowed to flow around the components mounted to substrate 150, there is no need for the adhesive tape 310 to be thermally conductive. In fact, adhesive tape 310 may be non-conductive. Adequate cooling of the components is accomplished through simple air convection cooling. TLA 300 may be of any suitable material, but one preferred embodiment uses a thin, planar, stainless steel sheet because of its rust resistance and thermal properties. A stainless steel TLA 300 can sustain solder reflow cycle parameters (e.g., over 185° C. for 2–4 minutes).

The adhesive tape 310 also is thick enough and has sufficient compressibility that it absorbs pressure and shock to the package encountered during processing and handling. Damage to the package due to mechanical shock, vibration, and repeated thermal expansion and contraction due to thermal cycling during operation are all minimized because adhesive tape 310 dampens their effects.

Adhesive tape 310 may be made with any suitable materials. A suitable tape core provides adequate bonding to the adhesive materials themselves. Adequate adhesive materials are those which provide sufficient bond strength to pick up the chip package. Important in the selection of adhesives is that each withstands the temperatures reached during surface mount attachment reflow processes, where the solder balls are allowed to reform and bond the substrate 150 to a printed circuit board 130. Often, these temperatures reach 220° C. or more. A typical reflow process requires temperatures over 185° C. for 2–4 minutes. Not only must the adhesive not melt during these processes, but the adhesive tape 310 as a whole cannot be thermally degraded or take on a permanent set which would preclude easy removal following the thermal reflow processes.

Adhesive tapes 310 which were tested during development of the invention include: aluminum foil (3M PN 363);

fabric with glass backing (3M PN 361); Kapton PTFE (3M PN 5480); polyimide (3M PN 8901); silicone (CHR FURON K100); and acrylic (3M PN 9469). The silicone (CHR FURON K100) tape was tested, successfully, under a thermal stability test of 260° C. for 20 minutes (normal operating conditions are 220° C. for 2–4 minutes). The adhesive tape 310 and modules 100 were also subjected to loads of 65 lbs. without damage to the TLA 300 or components. Normal loads might reach 30 lbs.

Adhesive tape 310 may be attached to all of the microchips as shown in FIG. 4, or it may be attached only to those chips 120 which extend vertically the greatest distance from the substrate 150 (not shown in FIG. 4). This decision will be dictated by the number of chips 120 on the substrate 150 and their relative sizes. The main concern regarding the attachment of the adhesive tape 310 is that enough contact be made for a given adhesive so that adequate support is achieved to prevent the package from being dropped during movement while attached to the vacuum probe 110 through TLA 300.

The adhesive should also be selected such that removal is easy and the adhesive does not leave any residue on the chip surface. This is important because such a residue could interfere with subsequent attachment of devices such as heatsinks. Heatsinks, for example, are often attached via another adhesive, and such subsequent attachment schemes could be adversely affected if a residue is left from the first adhesive.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A microelectronic package module for use in the manufacture of a printed circuit board, said package module comprising:
   a substrate;
   at least one microchip with an upper face and a lower face attached on its lower face to said substrate;
   a temporary, removable lid having a top surface and a bottom surface attached to only said microchip and not to any other part of said package; and
   a removable adhesive having a top adhesive surface attaching the removable adhesive to the bottom surface of the lid and a bottom adhesive surface removably attaching the removable adhesive and the lid to only said upper face of the microchip.

2. The microelectronic package module of claim 1 wherein the lid is a thin, planar, metal sheet.

3. The microelectronic package module of claim 2 wherein the lid is stainless steel.

4. The microelectronic package module of claim 1 wherein the adhesive is a double-sided adhesive tape.

5. The microelectronic package module of claim 4 wherein the adhesive tape comprises a core and at least one adhesive material, said core selected from the group consisting of aluminum foil, fabric with glass backing, polytetrafluoroethylene, and polyimide, and wherein said adhesive material is selected from the group consisting of silicone and acrylic.

6. The microelectronic package module of claim 4 wherein the removable adhesive is silicone.

7. The microelectronic package module of claim 1 wherein the removable adhesive is thermally non-conductive.

8. A microelectronic package module for use in the manufacture of a printed circuit board, said package module comprising:
   a substrate;
   at least one microchip with an upper face and a lower face attached on its lower face to said substrate;
   a thin, planar lid having a top surface and a bottom surface attached to only said microchip and not to any other part of said package;
   a double-sided removable adhesive tape having a top adhesive surface attaching the removable adhesive tape to the bottom surface of the lid and a bottom adhesive surface removably attaching the removable adhesive tape and the lid to only the upper face of the microchip.

9. The microelectronic package module of claim 8 where the lid is metal.

10. The microelectronic package module of claim 9 wherein the lid is stainless steel.

11. The microelectronic package module of claim 8 wherein the removable adhesive tape comprises a core and at least one adhesive material, said core selected from the group consisting of aluminum foil fabric with glass backing, polytetrafluoroethylene, and polyimide, and wherein said adhesive material is selected from the group consisting of silicone and acrylic.

12. The microelectronic package module of claim 8 wherein the removable adhesive tape is silicone.

13. The microelectronic package module of claim 8 wherein the removable adhesive tape is thermally non-conductive.

* * * * *